(12) United States Patent
Bo et al.

(10) Patent No.: US 7,678,698 B2
(45) Date of Patent: Mar. 16, 2010

(54) METHOD OF FORMING A SEMICONDUCTOR DEVICE WITH MULTIPLE TENSILE STRESSOR LAYERS

(75) Inventors: Xiangzheng Bo, Austin, TX (US); Tien Ying Luo, Beacon, NY (US); Kurt H. Junker, Austin, TX (US); Paul A. Grudowski, Austin, TX (US); Venkat R. Kolagunta, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 238 days.

(21) Appl. No.: 11/744,581

(22) Filed: May 4, 2007

(65) Prior Publication Data

US 2008/0272411 A1 Nov. 6, 2008

(51) Int. Cl.
*H01L 21/44* (2006.01)

(52) U.S. Cl. .................. 438/680; 438/197; 438/724; 257/288

(58) Field of Classification Search .............. 257/288, 257/E21.24; 438/197, 680, 724
See application file for complete search history.

(56) References Cited

U.S. PATENT DOCUMENTS

| | | | |
|---|---|---|---|
| 6,602,790 B2 | 8/2003 | Kian et al. | |
| 6,902,971 B2 | 6/2005 | Grudowski | |
| 6,924,241 B2 | 8/2005 | Lee | |
| 7,001,850 B2 | 2/2006 | Nemani et al. | |
| 7,381,602 B2* | 6/2008 | Hohage et al. | 438/197 |
| 2006/0009041 A1* | 1/2006 | Iyer et al. | 438/724 |
| 2006/0102076 A1 | 5/2006 | Smith et al. | |
| 2006/0105106 A1 | 5/2006 | Balseanu et al. | |
| 2006/0118892 A1 | 6/2006 | Wu et al. | |
| 2006/0246672 A1 | 11/2006 | Chen et al. | |
| 2006/0269693 A1* | 11/2006 | Balseanu et al. | 427/569 |
| 2007/0132054 A1* | 6/2007 | Arghavani et al. | 257/506 |
| 2008/0138983 A1* | 6/2008 | Lien et al. | 438/680 |

OTHER PUBLICATIONS

International Search Report and Written Opinion.
Dharmadlikari, V. et al.; "UV-assisted processing for advanced dielectric films"; Solid State Technology; Mar. 2005; pp. 43-44 & 46; www.solid-state.com.
U.S. Appl. No. 11/460,742, filed Jul. 28, 2006.
U.S. Appl. No. 11/655,461, filed Jan. 19, 2007.

* cited by examiner

*Primary Examiner*—Thao X Le
*Assistant Examiner*—Eric W Jones
(74) *Attorney, Agent, or Firm*—Robert L. King; David G. Dolezal

(57) ABSTRACT

A semiconductor device has at least two tensile stressor layers that are cured with UV radiation. A second tensile stressor layer is formed after a first stressor layer. In some examples, the tensile stressor layers include silicon nitride and hydrogen. In some examples, the second tensile stressor layer has a greater shrinkage percentage due to the curing than the first tensile stressor layer. In one form, the second tensile stressor layer after the curing exerts a greater tensile stress than the first tensile stressor layer. The tensile stressors layers are utilized to improve carrier mobility in an N-channel transistor and thus enhance transistor performance. In one form a single group of overlying tensile stressor layers is provided with each layer being increasingly thicker and having increasingly more hydrogen prior to being cured. In other embodiments multiple overlying groups are formed, each group having a similar repeating depth and hydrogen profile.

18 Claims, 5 Drawing Sheets

| PROCESS CONDITIONS FOR STRESSOR LAYERS | | |
|---|---|---|
|  | LAYER 34 | LAYER 56 |
| DEPOSITION (LAYERS 36, 40, 44, 48, 52) | $SiH_4$ 20 sccm | 33 sccm |
|  | $NH_3$ 40 sccm | 550 sccm |
|  | $N_2$ 12500 sccm | 2000 sccm |
| PLASMA N2 TREATMENT (REGIONS 38, 42, 46, 50, 54) | $SiH_4$ 0 | 0 |
|  | $NH_3$ 0 | 0 |
|  | $N_2$ 12500 sccm | 2000 sccm |

METHOD OF FORMING A SEMICONDUCTOR DEVICE WITH MULTIPLE TENSILE STRESSOR LAYERS

BACKGROUND

1. Field

This disclosure relates generally to semiconductors, and more specifically, to a process for manufacturing a semiconductor device.

2. Related Art

Stress in a channel region of a transistor is used to improve the performance of the transistor by increasing the current drive strength of the transistor. It is well documented that a tensile stress in the channel of an N-channel transistor improves carrier mobility while a compressive stress in the channel of a P-channel transistor improves carrier mobility. Tensile stress in a transistor channel has been previously created by applying a stressor layer over the gate of the transistor. The stressor layer applies stress to the channel region of the transistor through the transistor's gate and source/drain regions. Lattice strain in a transistor's channel region increases the carrier mobility of transistor and increases the saturation current of the silicon transistors to improve performance. Silicon nitride is a well known stressor material.

Issues associated with the use of stressor layers include the cracking of such layers as semiconductor dimensions have become small. Stress fractures in stressor layers are prone to develop in areas of a transistor having angled structures such as at the corners of a transistor's gate. The current drive capability of transistors continue to need to increase to higher current values. Thus an improved transistor stressor which is reliable while continuing to improve transistor performance is desired.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
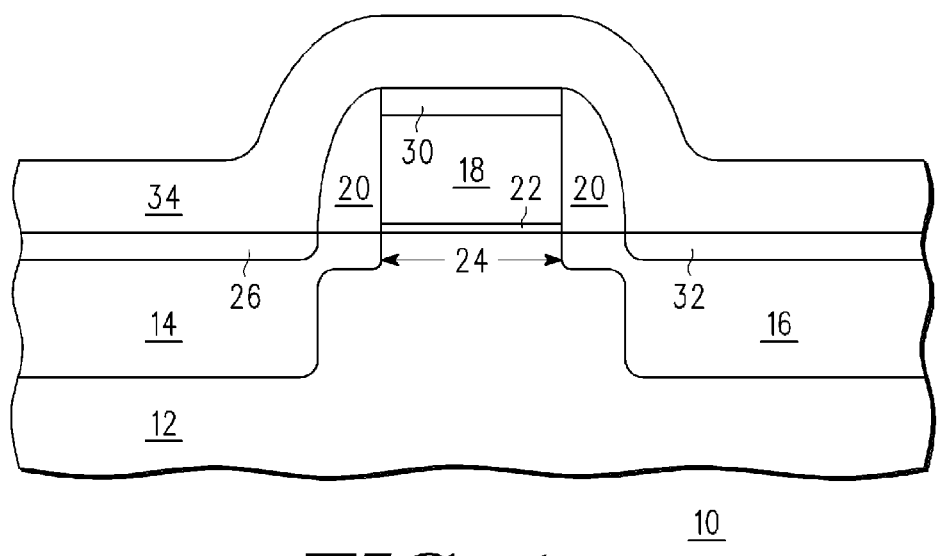
FIGS. 1, 3 and 5-7 illustrate in cross-sectional form a semiconductor structure created by one form of a method in accordance with the present invention.

Illustrated in FIG. 1 is a cross-sectional view of a process for making a semiconductor device 10. In the illustrated form the semiconductor device 10 is an N-channel metal oxide semiconductor (MOS) transistor. Therefore, to improve the performance of semiconductor device 10 a tensile stress applied to the channel region is required. A semiconductor substrate 12 is initially provided. In one form the semiconductor substrate 12 is a silicon substrate. However, the semiconductor substrate 12 can be any semiconductor material or combinations of materials, such as gallium arsenide, silicon germanium, silicon-on-insulator (SOI), silicon, monocrystalline silicon, the like, and combinations of the above. Overlying the semiconductor substrate 12 is a gate dielectric layer 22. In one form the gate dielectric layer 22 is an oxide such as silicon dioxide and is thermally grown on semiconductor substrate 12 when the semiconductor substrate 12 is silicon. In other forms the gate dielectric layer 22 may be implemented with any of various high-K or high permittivity dielectric materials. It should be appreciated that the drawings discussed herein are not necessarily proportioned to size for purposes of explanation. Semiconductor device 10 further has a source region 14 and a drain region 16 formed within the semiconductor substrate 12. Overlying the gate dielectric layer 22 is a control terminal or gate 18 of the semiconductor device 10. Electrically connecting each of the source region 14, drain region 16 and gate 18 is a conductive silicide region. For example, a silicide region 26 is within and at an upper surface of the source region 14. A silicide region 32 is within and at an upper surface of the drain region 16. A silicide region 30 is within and at an upper surface of the gate 18. The transistor that semiconductor device 10 represents has a channel 24 underlying the gate 18. Adjacent to the control terminal or gate 18 is a sidewall spacer 20. Up to this point in the discussion the transistor that has been described is conventional. Overlying the transistor is a first tensile stressor layer 34. In one form the first tensile stressor layer 34 is formed of silicon nitride and is formed as a composite structure that is illustrated in further detail in FIG. 2.

Figure 2:
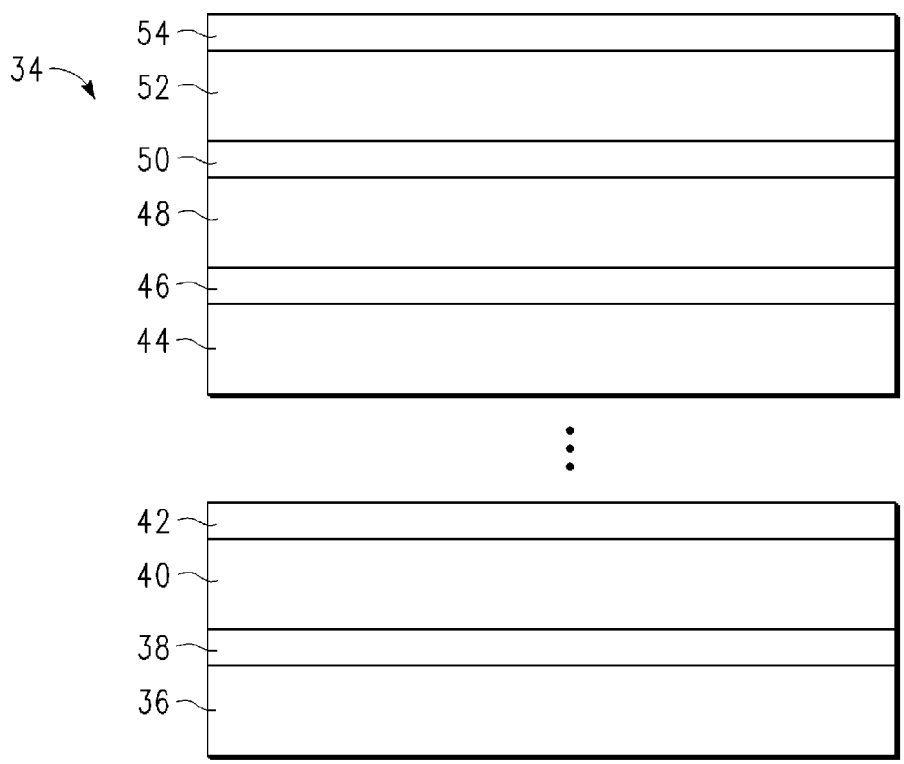
FIG. 2 illustrates in cross-sectional form further detail of a tensile stressor layer of FIG. 1.

Illustrated in FIG. 2 is further detail of the first tensile stressor layer 34 of FIG. 1. A layer 36 is formed by a plasma enhanced chemical vapor deposition (PECVD) and contains silane ($SiH_4$), ammonia ($NH_3$) and nitrogen ($N_2$) in predetermined ratios to be described below. Overlying layer 36 is a nitrogen rich region 38 of layer 36 that is formed from a plasma treatment of nitrogen to layer 36. It should be noted that the nitrogen rich region 38 is originally a portion of layer 36 that becomes nitrogen rich. Overlying layer 36 is a layer 40 which is also formed by the plasma enhanced chemical vapor deposition (PECVD) of silane ($SiH_4$), ammonia ($NH_3$) and nitrogen ($N_2$) in predetermined ratios. At the top of layer 40 is a nitrogen rich region 42 which is formed from a plasma treatment of nitrogen of layer 40. Between layer 40 and a layer 44 is a plurality of intervening layers (not shown) with nitrogen rich portions that are analogous to layer 36 and layer 40. The layer 44 is formed by plasma enhanced chemical vapor deposition (PECVD) and contains silane ($SiH_4$), ammonia ($NH_3$) and nitrogen ($N_2$). Within layer 44 and at an upper surface is a nitrogen rich region 46 which is formed from a plasma treatment of nitrogen of layer 44. Nitrogen rich region 46 is approximately the same depth as each of nitrogen rich regions 42 and 38. Layer 44 is approximately the same depth as each of layers 40 and 36. Overlying layer 44 is a layer 48 that is also formed by the plasma enhanced chemical vapor deposition (PECVD) of silane ($SiH_4$), ammonia ($NH_3$) and nitrogen ($N_2$) in predetermined ratios. At an upper surface of layer 48 is a nitrogen rich region 50 formed from a plasma treatment of nitrogen. Overlying layer 48 is a layer 52 that is also formed by the plasma enhanced chemical vapor deposition (PECVD) of silane ($SiH_4$), ammonia ($NH_3$) and nitrogen ($N_2$) in predetermined ratios. In the upper portion of layer 52 is a nitrogen rich region 54 formed from a plasma treatment of nitrogen. Each of layers 48 and 52 has a depth or thickness that is approximately the same as layers 36, 40 and 44. Each of nitrogen rich regions 50 and 54 has a depth or thickness that is approximately the same as nitrogen rich regions 38, 42 and 46. Therefore, the first tensile stressor layer 34 is a composite layer of various layers that are formed in a sequential manner by alternating between a deposition step and a PECVD step. The total thickness of the first tensile stressor layer 34 is a function of how many sub-layers are formed as well as the thickness selected for each individual layer. The thickness of each layer is determined largely by the amount of time chosen for the deposition step.

Figures 3, 4:
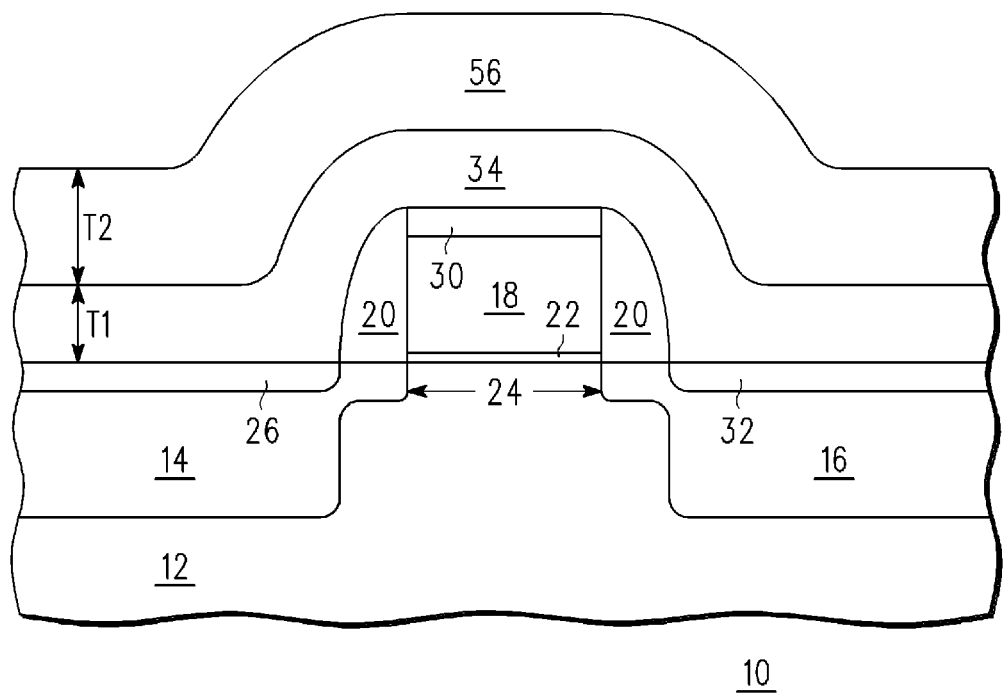
FIG. 4 illustrates in tabular form process conditions for forming stressor layers in accordance with one form of the present invention.

Illustrated in FIG. 3 is further processing of semiconductor device 10 wherein a second tensile stressor layer 56 is formed in direct contact with and overlying the first tensile stressor layer 34. The second tensile stressor layer 56 has a thickness or depth indicated as T2 whereas the first tensile stressor layer 34 has a thickness or depth indicated as T1. In the illustrated form the depth T2 is greater than the depth T1. The second tensile stressor layer 56 is formed of a plurality of individual layers as previously described in connection with the first tensile stressor layer 34. In particular, the second tensile stressor layer 56 has a predetermined number of pairs of layers in which a first layer is formed by a deposition of silane, ammonia and nitrogen in predetermined amounts. The second layer of each of the pairs of layers is formed by a nitrogen plasma treatment. Details of the amounts of these materials will be provided below. For convenience of illustration, the composite nature of each of the first tensile stressor layer 34 and the second tensile stress layer 56 is not detailed in FIG. 3. As will be described below, the second tensile stress layer 56 has a higher concentration of hydrogen than the first tensile stressor layer 34. The result of this difference in composition is that the first tensile stressor layer 34 initially has a higher tensile stress than the second tensile stressor layer 56.

Illustrated in FIG. 4 is a table that describes process conditions for the first tensile stressor layer 34 and the second tensile stressor layer 56. From the table it can be readily seen that there are two process steps to form each of the first tensile stressor layer 34 and the second tensile stressor layer 56. A first process step is a deposition step used to form layers 36, 40, 44, 48 and 52 of the first tensile stressor layer 34 and analogous layers of the second tensile stressor layer 56. A second process step is a plasma nitrogen treatment step used to form the nitrogen rich regions 38, 42, 46, 50 and 54 of the first tensile stressor layer 34 and analogous nitrogen rich regions of the second tensile stressor layer 56. From the FIG. 4 table it can be seen that the chemical composition used in each process step to form the first tensile stressor layer 34 and the second tensile stress layer 56 is significantly different. In particular, when forming the layers of the first tensile stressor layer 34 a composition of 20 Standard Cubic Centimeters per Minute (SCCM) of silane, $SiH_4$, 40 SCCM of ammonia, $NH_3$, and 12,500 SCCM of nitrogen is used. As a result, the individual layers that form the first tensile stressor layer 34 are high in nitrogen and relatively low in hydrogen content. For example the first tensile stressor layer 34 may have a hydrogen content of approximately eighteen percent (18%). The plasma treatment of each of layers 36, 40, 44, 48 and 52 to form the nitrogen rich regions 38, 42, 46, 50 and 54 is implemented with approximately 12,500 SCCM of nitrogen. As a result of this high composition of nitrogen the nitrogen rich regions 38, 42, 46, 50 and 54 readily form.

The chemistry used to form the second tensile stress layer 56 is modified. When forming individual layers within the second tensile stress layer 56 that are analogous to layers 36, 40, 44, 48 and 52 of the first tensile stressor layer 34, approximately 33 SSCM of $SiH_4$, 550 SSCM of $NH_3$ and 2,000 SCCM of nitrogen are used in the PECVD process. As a result, the second tensile stressor layer 56 has a higher hydrogen content than the first tensile stressor layer 34. The chemistry used to form the nitrogen rich regions within the layers of the second tensile stress layer 56 is also different from the chemistry used to form the nitrogen rich regions within the layers of the first tensile stressor layer 34. In particular, the amount of nitrogen used in the plasma nitrogen treatment of the layers of the second tensile stress layer 56 is, in one form, approximately 2,000 SCCM. As a result of the chemistry described herein the first tensile stressor layer 34 has a lower hydrogen content than the second tensile stress layer 56 and the first tensile stress layer has a higher stress as a result. For example, the hydrogen content of the second tensile stress layer 56 in one form is twenty percent or more. It should be understood that the particular chemical concentrations provided in the table of FIG. 4 are illustrative only. A range of each of the various chemical elements may be implemented as long as the hydrogen content of the first tensile stressor layer 34 is lower than the hydrogen content of the second tensile stress layer 56.

Figure 5:
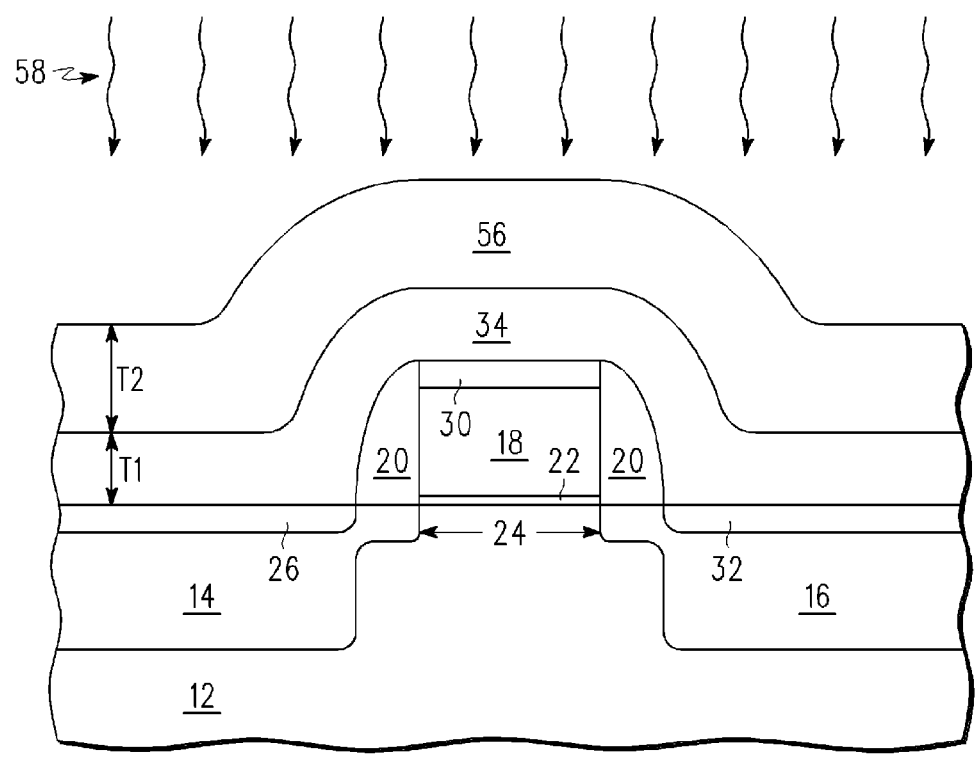

Illustrated in FIG. 5 is further processing of the semiconductor device 10 wherein an ultraviolet (UV) anneal 58 is performed. In one form the semiconductor device 10 is exposed to ultraviolet light at an elevated temperature. An exemplary temperature for the UV anneal 58 is any temperature within a range of approximately 300 degrees Celsius to 500 degrees Celsius for approximately five to thirty minutes. It should be understood that temperatures below this range may be used but longer processing time would generally be required. Temperatures above this range may also be used but it generally is detrimental to other portions of an integrated circuit to use higher temperatures. A suitable UV radiation source is, for example, an excimer ultraviolet source that provides a single ultraviolet wavelength of 172 nm or 222 nm. A suitable broadband source may be utilized which is adapted to generate ultraviolet radiation having wavelengths of from about 200 nm to about 400 nm. Suitable ultraviolet lamps that radiate at other wavelengths may comprise Xe gas, which generates UV radiation having a wavelength of 172 nm. Mercury lamps radiate at a wavelength of 243 nm, deuterium lamps radiate at a wavelength of 140 nm and $KrCl_2$ lamps radiate at a wavelength of 222 nm.

Figure 6:
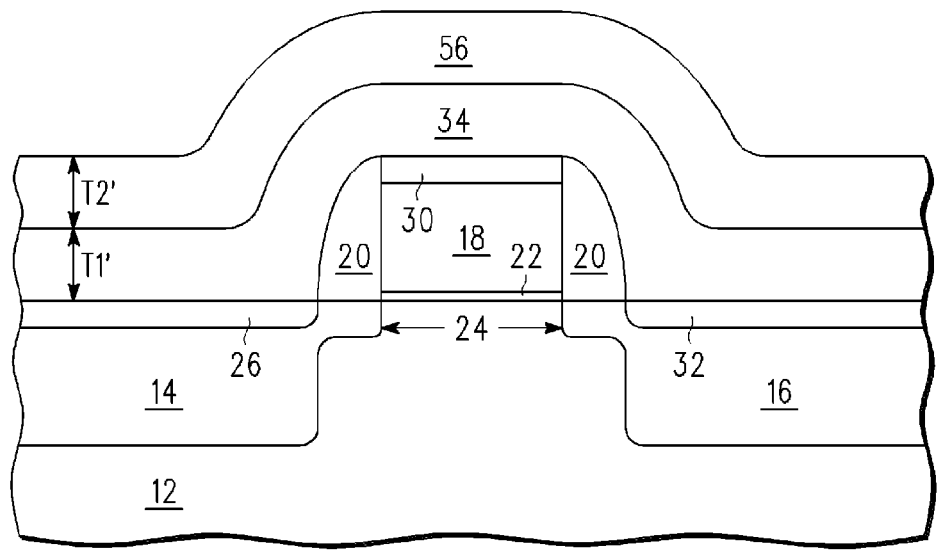

Illustrated in FIG. 6 is further processing of semiconductor device 10 subsequent to the UV anneal 58. In particular the UV anneal 58 causes the second tensile stress layer 56 to shrink and change its thickness from an original thickness of T2 to a modified thickness of T2'. In one form the volume shrinkage is approximately five to six percent volume shrinkage. It should be well understood that this amount of shrinkage is exemplary only and other volume percentages, generally less than twelve percent, may occur. Similarly, there is some, but much less, shrinkage of the first tensile stressor layer 34. In any event, the volume shrinkage of the first tensile stressor layer 34, while close to zero, is very small compared to the volume shrinkage of the second tensile stress layer 56. The first tensile stressor layer 34 has an original thickness of T1 but is modified to a thickness of T1'. The UV anneal 58 is performed for a period of time to adjust the thicknesses of the two tensile stress layers. In one form the two tensile stress layers are formed to be about the same in depth. Prior to the UV anneal 58 the first tensile stressor layer 34 is higher than the second tensile stress layer 56. However, after the curing which occurs from the UV anneal 58 the tensile stress of the second tensile stress layer 56 increases and exerts a higher stress than the first tensile stress layer 34. In one form the tensile stress exerted by the second tensile stress layer 56 after the UV anneal 58 is greater than 1.2 Giga Pascals (GPa).

Figure 7:
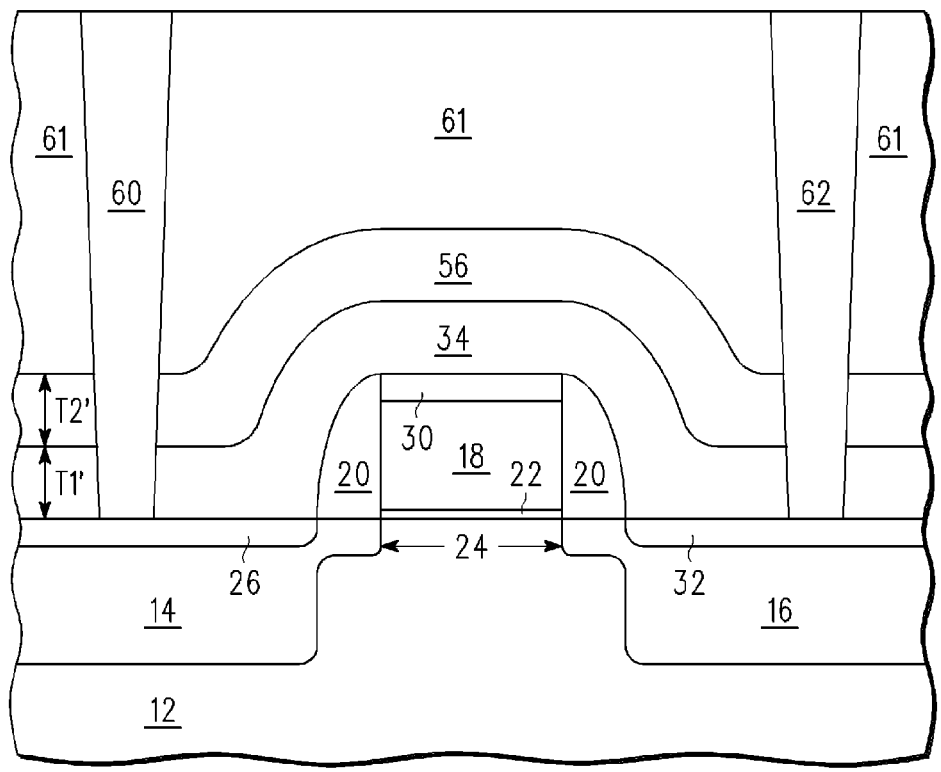

Illustrated in FIG. 7 is further processing of semiconductor device 10 wherein an interlevel dielectric (ILD) 61 is formed overlying the semiconductor device 10. The interlevel dielectric (ILD) 61 is an insulating layer and in one form is formed of TEOS, a known dielectric. A contact 60 is formed within the interlevel dielectric (ILD) 61 to make electrical contact to the source region 14 via the silicide region 26. A contact 62 is formed within the interlevel dielectric (ILD) 61 to make electrical contact to the drain region 16 via the silicide region 32. Electrical contact to the gate 18 via the silicide region 30 is typically formed lateral to the illustrated cross-sectional view because the dimensions of the gate 18 are small. Adjacent to the gate a contact region that is larger than the gate dimensions may be formed for more reliable contact. Thus it should be appreciated that there has been provided an N-channel transistor having improved current drive capability as a result of having a stressor layer that has at least two sections of differing stress characteristics wherein a lower stress characteristic portion is positioned closer to the transistor channel than a high stress characteristic portion.

It should be understood that in other forms one or more tensile stressor layers may be formed overlying tensile stressor layer 56. For example, a third adjacent tensile stressor layer shown below in connection with the following figures could be provided. In one form the third tensile stressor layer would have a thickness greater than each of the first two underlying stressor layers. The composition of the third tensile stressor layer would include more hydrogen than each of the underlying tensile stressor layers. After a UV anneal the third tensile stressor layer would shrink more in thickness than each of the underlying tensile stressor layers and would therefore provide more tensile stress than each of the individual underlying tensile stress layers. Additional overlying tensile stressor layers having a thickness and hydrogen content that increases the tensile stress from above may be included.

Figure 8:
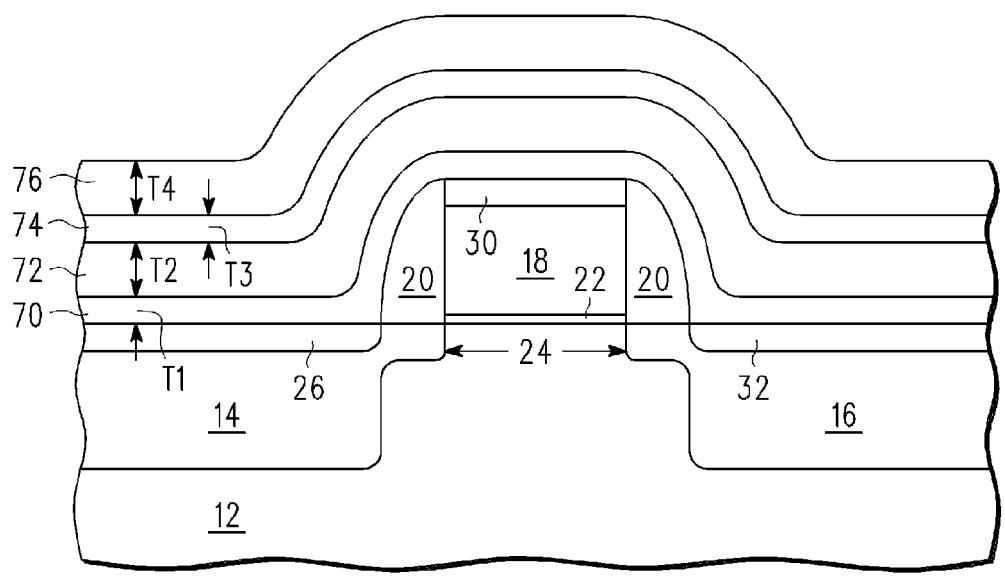
FIGS. 8-10 illustrate in cross-sectional form another semiconductor structure created by another form in accordance with the present invention.

Illustrated in FIG. 8 is another form of an N-channel transistor having a stressor layer that significantly increases the performance and particularly the current drive capability of the transistor. A semiconductor device 75 is illustrated wherein elements that are common with semiconductor device 10 discussed above are similarly numbered for convenience of comparison. Semiconductor device 75 therefore has source region 14 and drain region 16 within the semiconductor substrate 12. Channel 24 underlies the gate dielectric 22 and the gate 18. Silicide regions 26, 30 and 32 respectively are formed within the source region 14, the gate 18 and the drain region 16. Overlying the N-channel transistor is a tensile stressor layer 70 having a thickness of T1. The tensile stressor layer 70 in one form is a silicon nitride layer that has a composition analogous to first tensile stressor layer 34 of semiconductor device 10. The tensile stressor layer 70 is deposited by PECVD at a temperature in the range of approximately 300 degrees Celsius to 500 degrees Celsius. A tensile stressor layer 72 is formed by PECVD overlying the tensile stressor layer 70 and is analogous to tensile stressor layer 56 of semiconductor device 10. The tensile stressor layer 72 has a thickness of T2 which is greater than thickness T1. A tensile stressor layer 74 is formed by PECVD overlying the tensile stressor layer 72 and is analogous to tensile stressor layer 70. Tensile stressor layer 74 has a thickness T3 which is substantially the same as thickness T1. Tensile stressor layer 76 is formed by PECVD overlying the tensile stressor layer 74 and has a thickness of T4. Thickness T4 has a thickness substantially the same as thickness T2. Tensile stressor layer 76 is analogous in composition to tensile stressor layer 72. In the illustrated form the hydrogen content of tensile stressor layers 70 and 74 is less than the hydrogen content of tensile stressor layers 72 and 76. At this point in the processing the stress characteristics of tensile stressor layers 70 and 74 is greater than the stress characteristics of tensile stressor layers 72 and 76.

Figure 9:
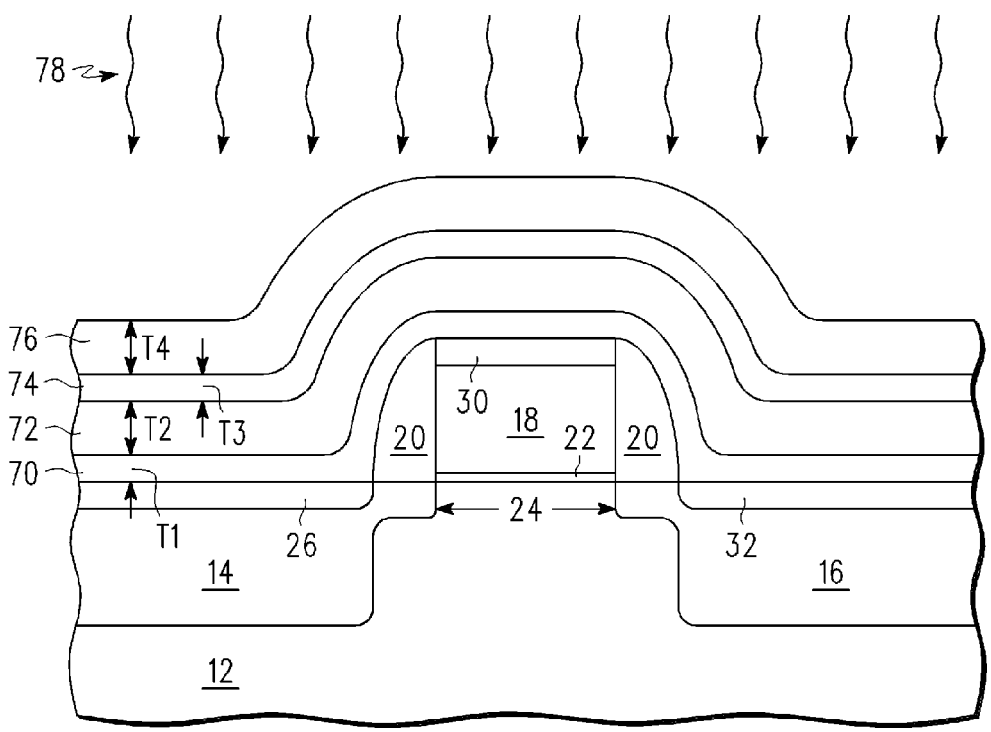

Illustrated in FIG. 9 is further processing of semiconductor device 75. An ultraviolet (UV) anneal 78 analogous to UV anneal 58 of FIG. 5 is performed within the temperature range of approximately 300 degrees Celsius to 500 degrees Celsius. The values of the radiation frequency, the temperature and the time of the anneal are variable. The heat from the anneal or cure process physically modifies the semiconductor device 75 and also modifies the tensile stress characteristics of the various stressor layers.

Figure 10:
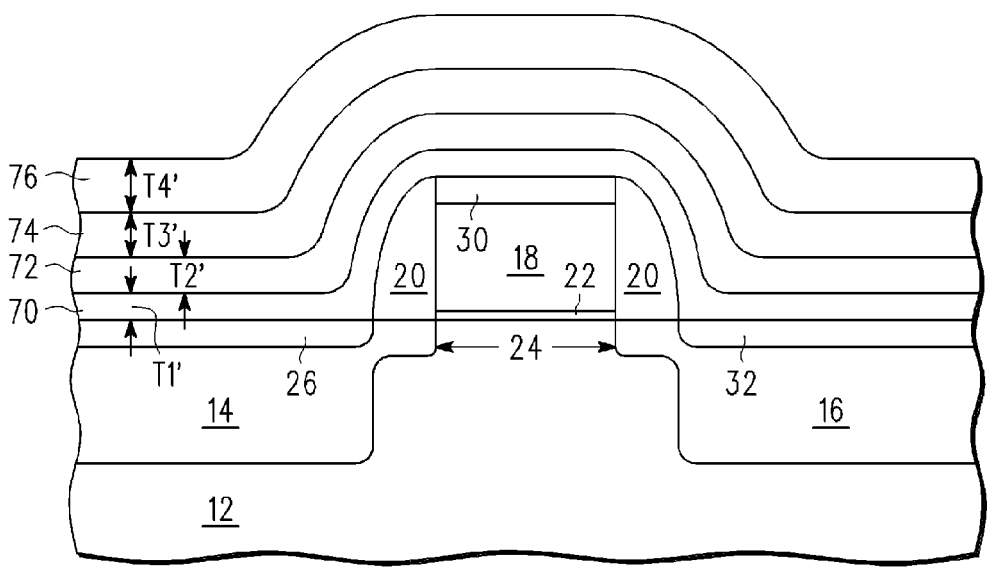

Illustrated in FIG. 10 is a resultant tensile stressor in the semiconductor device 75. All of the depths of the tensile stressor layers 70, 72, 74 and 76 have been modified by making the depths smaller as reflected by the modified depth designations of T1', T2', T3' and T4'. The depth of tensile stressor layer 76 and tensile stressor layer 72 is shrunk by a volume percentage sufficient to respectively make modified depths T4' and T2' substantially the same as the modified depths T1' and T3'. Within the combination of tensile stressor layers 70, 72, 74 and 76, the tensile stressor layer 70 has a tensile stress characteristic that is lower than that of the tensile stressor layer 72. The tensile stressor layer 74 similarly has a tensile stress characteristic that is lower than that of the tensile stressor layer 76. The UV anneal 78 functioned to reverse the stress characteristic of these noted layers. By having a greater stress characteristic at the top of each pair of layers in the composite stressor layer, greater tensile stress and more uniform tensile stress is applied to the channel 24 of semiconductor device 75. The increased stress directly increases the current drive capability of the N-channel transistor. Because the stressor is formed of a combination of individual and discrete stressor layers, the stressor is less susceptible to cracking running entirely through the stressor.

In other forms using more than two tensile stressor layers, a repetition of groupings of three tensile stressor layers may be implemented. In a first grouping of three tensile layers, each overlying layer has a greater tensile stress characteristic than the immediately underlying tensile stress layer. A second grouping of three tensile stress layers is formed overlying the first grouping of three tensile stress layers. As a result, the first tensile stress layer of the second grouping overlies the third tensile stress layer of the first grouping and has a lower tensile stress characteristic even though it is overlying the third tensile stress layer. Significant improvement in transistor performance is provided from such an arrangement as well.

In another form using more than two tensile stressor layers, a repetition of groupings of two tensile stressor layers may be implemented. In each grouping, a second overlying tensile stress layer has a higher stress characteristic than an immediately underlying first tensile stress layer of the grouping. Between groupings of the pairs of tensile stress layers, a first tensile stress layer of one grouping will overlie a second tensile stress layer of an underlying grouping and have a lower tensile stress characteristic than the immediately underlying tensile stress layer. Significant improvement in transistor performance is also provided from such an alternate arrangement as well.

By now it should be appreciated that there has been provided a method for forming a semiconductor device, such as a transistor, having improved transistor drive current and thus improved performance. Numerous embodiments described herein may be used and the selection of which embodiment may depend upon processing requirements and desired transistor specifications.

In one form there is herein provided a method in which a control terminal of a transistor is formed over a substrate. A first tensile stressor layer is formed over the substrate after the forming the control terminal. A second tensile stressor layer is formed over the first tensile stressor layer. The first tensile stressor layer and the second tensile stressor layer are cured with UV radiation, wherein the first tensile stressor layer exerts a first tensile stress and the second tensile layer exerts a second tensile stress. After the curing, the first tensile stress is lower than the second tensile stress. In one form, before the curing, the first tensile stress is greater than the second tensile stress. In another form the forming of the first tensile stressor layer includes forming the first tensile stressor layer to include silicon nitride and hydrogen. In that embodiment, forming the second tensile stressor layer includes forming the second tensile stressor layer to include silicon nitride and hydrogen. In one form prior to the curing, a hydrogen concentration of the second layer is greater than a hydrogen concentration of the first layer. In another embodiment forming the first tensile stressor layer includes forming a first plurality of layers including silicon nitride and hydrogen. After each layer of the first plurality is formed, each layer of the first plurality is treated with a nitrogen plasma treatment. In this embodiment forming the second tensile stressor layer includes forming a second plurality of layers including silicon nitride and hydrogen. In this embodiment after each layer of the second plurality is formed, the each layer of the second plurality is treated with a nitrogen plasma treatment. In this form prior to the curing, a hydrogen concentration of each layer of the second plurality is greater than a hydrogen concentration of each layer of the first plurality. In this form the forming of the first tensile stressor layer includes forming the first tensile stressor layer to have a first thickness, and the forming of the second tensile stressor layer includes forming the second tensile stressor layer to have a second thickness. Prior to the curing, the second thickness is greater than the first thickness. In another form a shrinkage percentage of the second tensile stressor layer due to the curing is greater than a shrinkage percentage of the first tensile stressor layer due to the curing. In another form after the curing, the second tensile stress is greater than 1.2 Giga Pascals. In yet another form a third tensile stressor layer is formed over the second tensile stressor layer. The third tensile stressor layer exerts a third tensile stress. In this form the curing includes curing the third tensile stressor layer. After the curing, the third tensile stress is greater than the second tensile stress. In yet another form a third tensile stressor layer is formed over the second tensile stressor layer wherein the third tensile stressor layer exerts a third tensile stress. The curing includes curing the third tensile stressor layer. After the curing, the third tensile stress is greater than the second tensile stress. In yet another form a fourth tensile stressor layer is formed over the third tensile stressor layer. The fourth tensile stressor layer exerts a fourth tensile stress. The curing includes curing the fourth tensile stressor layer, and wherein after the curing, the fourth tensile stress is greater than the third tensile stress.

In another form there is provided a method in which a control electrode of a transistor is formed over a substrate. A first layer is formed over the substrate after the forming the control electrode. The first layer includes silicon nitride. A second layer is formed over the first layer. The second layer includes silicon nitride. The first layer and the second layer are cured with UV radiation, wherein a shrinkage percentage of the second layer due to the curing is greater than a shrinkage percentage of the first layer due to the curing. In another embodiment forming the first layer includes forming the first layer to have a first thickness. The second layer is formed to have a second thickness. Prior to the curing, the second thickness is greater than the first thickness. In another embodiment forming the first layer includes forming the first layer to include a first concentration of hydrogen. Forming the second layer includes forming the second layer to include a second concentration of hydrogen. Prior to the curing, the first concentration of hydrogen is less than the second concentration of hydrogen. In one embodiment forming the first layer includes forming a first plurality of layers including silicon nitride and hydrogen. After each layer of the first plurality is formed, each layer of the first plurality is treated with a nitrogen plasma treatment. Forming the second layer includes forming a second plurality of layers including silicon nitride and hydrogen. After each layer of the second plurality is formed, treating the each layer of the second plurality with a nitrogen plasma treatment. Prior to the curing, a hydrogen concentration of each layer of the second plurality is greater than a hydrogen concentration of each layer of the first plurality. In another embodiment forming the first layer includes forming the first layer to have a thickness in the range of approximately 100 to 1,000 Angstroms. Forming the second layer includes forming the second layer to have a second thickness in the range of approximately 100 to 1,000 Angstroms. In another embodiment forming the first layer includes forming the first layer to exert a first tensile stress. Forming the second layer includes forming the second layer to exert a second tensile stress. Prior to the curing, the second tensile stress is less than the first tensile stress. After the curing, the second tensile stress is greater than the first tensile stress. In another form curing with UV radiation includes curing with UV radiation having wavelengths in a range of 140-400 nm. In another form a third layer is formed over the second layer. The third layer includes silicon nitride. In this form the curing includes curing the third layer, wherein a shrinkage percentage of the third layer due to the curing is greater than a shrinkage percentage of the second layer due to the curing. In yet another form a contact is formed for a current terminal region of the transistor, wherein forming the contact includes forming an opening in the first layer and an opening in the second layer.

In yet another form there is provided a semiconductor device having a transistor. The transistor includes a control electrode and a channel region in an active region. A first current terminal region is in the active region. A second current terminal region is in the active region. A first layer is located at least partially over the transistor, the first layer including silicon nitride and hydrogen, the first layer having a first concentration of hydrogen. A second layer is located over the first layer, the second layer including silicon nitride and hydrogen, the second layer having a second concentration of hydrogen, wherein the second concentration is higher than the first concentration. A contact extends through the second layer and the first layer and in electrical contact with the first current terminal region. In one form the transistor is an N-channel field effect transistor (FET).

Although the invention has been described with respect to specific conductivity types or polarity of potentials, skilled artisans appreciated that conductivity types and polarities of potentials may be reversed. Moreover, the terms "front," "back," "top," "bottom," "over," "under", "above", "below" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the method may be used to form other forms of transistors. For example, the stressor layers described herein may be implemented solely as sidewall spacers to a transistor gate rather than as a stressor layer overlying the gate of the transistor. In this form the sidewall spacer will have two distinct layers for applying tensile stress to the channel region of an N-channel transistor. Also, various semiconductor materials may be used in addition to the materials specifically listed herein. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method, comprising:
   forming a control terminal of a transistor over a substrate; forming a first tensile stressor layer over the substrate and overlying the control terminal after the forming the control terminal, wherein the first tensile stressor layer includes silicon nitride; forming a second tensile stressor layer over and in direct contact with the first tensile stressor layer and overlying the control terminal, wherein the second tensile stressor layer includes silicon nitride; forming a third tensile stressor layer over and in direct contact with the second tensile stressor layer and overlying the control terminal, wherein the third tensile stressor layer includes silicon nitride; forming a fourth tensile stressor layer over and in direct contact with the third tensile stressor layer and overlying the control terminal, wherein the fourth tensile stressor layer includes silicon nitride; and curing with UV radiation the first tensile stressor layer, the second tensile stressor layer, the third tensile stressor layer and the fourth tensile stressor layer, wherein the first tensile stressor layer exerts a first tensile stress, the second tensile stressor layer exerts a second tensile stress, the third tensile stressor layer exerts a third tensile stress, the fourth tensile stressor layer exerts a fourth tensile stress, wherein after the curing, the first tensile stress is lower than the second tensile stress, and the third tensile stress is lower than the fourth tensile stress, the first tensile stress layer and the second tensile stress layer forming a first pair and the third tensile stress layer and the fourth tensile stress layer forming a second pair, wherein a top layer of each pair has a greater stress characteristic than a lower layer of that pair.

2. The method of claim 1 wherein before the curing, the first tensile stress is greater than the second tensile stress.

3. The method of claim 1 wherein:
   the forming the first tensile stressor layer comprises forming the first tensile stressor layer to include silicon nitride and hydrogen; and
   the forming the second tensile stressor layer comprises forming the second tensile stressor layer to include silicon nitride and hydrogen.

4. The method of claim 3 wherein prior to the curing, a hydrogen concentration of the second tensile stressor layer is greater than a hydrogen concentration of the first tensile stressor layer.

5. The method of claim 3 wherein:
   the forming the first tensile stressor layer comprises:
      forming a first plurality of layers including silicon nitride and hydrogen; and
      after each layer of the first plurality of layers is formed, treating the each layer of the first plurality of layers with a nitrogen plasma;
   the forming the second tensile stressor layer comprises:
      forming a second plurality of layers including silicon nitride and hydrogen; and
      after each layer of the second plurality of layers is formed, treating the each layer of the second plurality of layers with a nitrogen plasma; and
   wherein prior to the curing, a hydrogen concentration of each layer of the second plurality of layers is greater than a hydrogen concentration of each layer of the first plurality of layers.

6. The method of claim 1 wherein:
   the forming the first tensile stressor layer comprises forming the first tensile stressor layer to have a first thickness;
   the forming the second tensile stressor layer comprises forming the second tensile stressor layer to have a second thickness; and
   wherein prior to the curing, the second thickness is greater than the first thickness.

7. The method of claim 1 wherein:
   a shrinkage percentage of the second tensile stressor layer due to the curing is greater than a shrinkage percentage of the first tensile stressor layer due to the curing.

8. The method of claim 1 wherein after the curing, the second tensile stress is greater than 1.2 Giga Pascals.

9. The method of claim 1 further comprising:
   the forming the third tensile stressor layer comprises forming the third tensile stressor layer to have a first thickness;
   the forming the fourth tensile stressor layer comprises forming the fourth tensile stressor layer to have a second thickness; and
   wherein prior to the curing, the second thickness is greater than the first thickness.

10. A method comprising:
   forming a control electrode of a transistor over a substrate;
   forming a first layer over the substrate and overlying the control electrode after the forming the control electrode, the first layer including silicon nitride;
   forming a second layer over and in direct contact with the first layer and overlying the control electrode, the second layer comprising silicon nitride;
   curing with UV radiation the first layer and the second layer, wherein a shrinkage percentage of the second layer due to the curing is greater than a shrinkage percentage of the first layer due to the curing;

forming a third layer over the substrate and overlying the control electrode, the third layer in direct contact with the second layer and including silicon nitride;

forming a fourth layer over and in direct contact with the third layer and overlying the control electrode; and curing with UV radiation the third layer and the fourth layer, wherein a shrinkage percentage of the fourth layer due to the curing is greater than a shrinkage percentage of the third layer due to the curing, wherein the first layer and the second layer form a first pair and the third layer and the fourth layer form a second pair, wherein a top layer of each pair has a greater stress characteristic than a lower layer of that pair.

11. The method of claim 10 wherein:

the forming the first layer comprises forming the first layer to have a first thickness;

the forming the second layer comprises forming the second layer to have a second thickness; and prior to the curing, the second thickness is greater than the first thickness.

12. The method of claim 11 wherein:

the forming the first layer comprises forming the first layer to include a first concentration of hydrogen;

the forming a second layer comprises forming the second layer to include a second concentration of hydrogen; and prior to the curing, the first concentration of hydrogen is less than the second concentration of hydrogen.

13. The method of claim 12 wherein:

the forming the first layer comprises:

forming a first plurality of layers including silicon nitride and hydrogen;

after each layer of the first plurality of layers is formed, treating the each layer of the first plurality of layers with a nitrogen plasma;

the forming the second layer comprises:

forming a second plurality of layers comprising silicon nitride and hydrogen;

after each layer of the second plurality of layers is formed, treating the each layer of the second plurality of layers with a nitrogen plasma; and wherein prior to the curing, a hydrogen concentration of each layer of the second plurality of layers is greater than a hydrogen concentration of each layer of the first plurality of layers.

14. The method of claim 10 wherein:

the forming the first layer comprises forming the first layer to have a thickness in a range of 100-1000 Angstroms; and the forming the second layer comprises forming the second layer to have a second thickness in the range of 100-1000 Angstroms.

15. The method of claim 10 wherein:

the forming the first layer comprises forming the first layer to exert a first tensile stress;

the forming a second layer comprises forming the second layer to exert a second tensile stress;

prior to the curing, the second tensile stress is less than the first tensile stress; and after the curing, the second tensile stress is greater than the first tensile stress.

16. The method of claim 10 wherein the curing with UV radiation comprises curing with UV radiation having wavelengths in a range of 140-400 nm.

17. The method of claim 10 wherein a shrinkage percentage of the third layer due to the curing is greater than a shrinkage percentage of the second layer due to the curing.

18. The method of claim 10 further comprising:

forming a contact for a current terminal region of the transistor, wherein the forming a contact comprises forming an opening in all layers overlying the current terminal region.

* * * * *

UNITED STATES PATENT AND TRADEMARK OFFICE
CERTIFICATE OF CORRECTION

| | | |
|---|---|---|
| PATENT NO. | : 7,678,698 B2 | Page 1 of 1 |
| APPLICATION NO. | : 11/744581 | |
| DATED | : March 16, 2010 | |
| INVENTOR(S) | : Bo et al. | |

It is certified that error appears in the above-identified patent and that said Letters Patent is hereby corrected as shown below:

IN THE CLAIMS:
Column 11, line 24, in Claim 12, delete "a" and insert -- the --.

Signed and Sealed this
Fifteenth Day of May, 2012

David J. Kappos
*Director of the United States Patent and Trademark Office*